US010141718B2

United States Patent
Garnache-Creuillot et al.

(10) Patent No.: US 10,141,718 B2
(45) Date of Patent: Nov. 27, 2018

(54) DUAL-FREQUENCY VERTICAL-EXTERNAL-CAVITY SURFACE-EMITTING LASER DEVICE FOR THZ GENERATION AND METHOD FOR GENERATING THZ

(71) Applicants: UNIVERSITE DE MONTPELLIER, Montpellier (FR); CENTRE NATIONAL DE LA RECHERCHE SCIENTIFIQUE, Paris (FR)

(72) Inventors: Arnaud Garnache-Creuillot, Montpellier (FR); Mikhael Myara, Sete (FR); Stéphane Blin, Murviel-lès-Montpellier (FR); Isabelle Sagnes, Paris (FR); Grégoire Beaudoin, Saint-Maur-des-Fossés (FR); Mohamed Sellahi, Montpellier (FR); Romain Paquet, Pezilla-la-Riviere (FR)

(73) Assignees: UNIVERSITE DE MONTPELLIER, Montpellier (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/511,199

(22) PCT Filed: Sep. 15, 2015

(86) PCT No.: PCT/EP2015/071139
§ 371 (c)(1),
(2) Date: Mar. 14, 2017

(87) PCT Pub. No.: WO2016/041993
PCT Pub. Date: Mar. 24, 2016

(65) Prior Publication Data
US 2017/0256913 A1    Sep. 7, 2017

(30) Foreign Application Priority Data

Sep. 15, 2014    (FR) .................................. 14 02058

(51) Int. Cl.
*H01S 5/14*        (2006.01)
*H01S 5/183*       (2006.01)
(Continued)

(52) U.S. Cl.
CPC .............. *H01S 5/14* (2013.01); *H01S 3/0804* (2013.01); *H01S 3/1065* (2013.01);
(Continued)

(58) Field of Classification Search
CPC ........ H01S 5/14; H01S 3/1065; H01S 3/0804; H01S 5/18361; H01S 5/0078;
(Continued)

(56) References Cited

U.S. PATENT DOCUMENTS

| 6,711,203 B1 | 3/2004 | Garnache et al. |
| 2002/0071463 A1 | 6/2002 | Garnache et al. |
| 2012/0063481 A1 | 3/2012 | Nagatomo |

OTHER PUBLICATIONS

Sellahi Mohamed et al: "Generation of new spatial and temporal coherent states using VECSEL technology: VORTEX, high order Laguerre-Gauss mode, continuum source", Proceedings of SPIE, SPIE—International Society for Optical Engineering, US, vol. 8966, Mar. 3, 2014 (Mar. 3, 2014), pp. 89660U-89660U, XP060034401, ISSN: 0277-786X, DOI: 10.1117/12.2040.*
(Continued)

*Primary Examiner* — Dung Nguyen
(74) *Attorney, Agent, or Firm* — Greer, Burns & Crain, Ltd.

(57) ABSTRACT

A laser device for generating an optical wave including at least two frequencies, such laser device including:
(Continued)

a first element including a gain region, a second mirror, distinct from the first element, and arranged so as to form with a first mirror an optical cavity including the gain region;

means for pumping the gain region so as to generate the optical wave;

means for shaping the light intensity of the optical wave arranged for selecting at least two transverse modes of the optical wave; and means for shaping the longitudinal and/or transversal phase profile of the optical wave and arranged for adjusting at least two transverse modes of the optical wave.

20 Claims, 7 Drawing Sheets

(51) Int. Cl.
    *H01S 5/00* (2006.01)
    *H01S 5/10* (2006.01)
    *H01S 3/08* (2006.01)
    *H01S 3/106* (2006.01)

(52) U.S. Cl.
    CPC .......... *H01S 5/0078* (2013.01); *H01S 5/1096* (2013.01); *H01S 5/183* (2013.01); *H01S 5/18361* (2013.01); *H01S 2301/16* (2013.01); *H01S 2302/02* (2013.01)

(58) Field of Classification Search
    CPC .... H01S 5/183; H01S 5/1096; H01S 2302/02; H01S 2301/16
    See application file for complete search history.

(56) References Cited

OTHER PUBLICATIONS

French Search Report from French Patent Application No. 1402058, dated Jul. 9, 2015.

International Search Report from International Patent Application No. PCT/EP2015/071139, dated Feb. 2, 2016.

Saili et al., "Experimental Demonstration of a Tunable Dual-Frequency Semiconductor Laser Free of Relaxation Oscillations," Optics Letters (2009), 34(21), pp. 3421-3423.

Barrientos et al., "Dual-Frequency Operation of a Vertical External Cavity Semiconductor Laser for Coherent Population Trapping Cesium Atomic Clocks," 12th European Quantum Electronics Conference, IEEE (2011), p. 1.

Gamache et al., "Single Frequency Tunable Sb-Based Vertical Cavity Surface Emitting Lasers Emitting at 2.3 μm," Conference on Lasers and Electro-Optics, IEEE (2004), pp. 1039-1040.

Gamache et al., "Control of New Spatial, Temporal and Polarization Coherent Light States with VeCSEL: VORTEX, Continuum, THz, Spin," Proceedings of the 2nd VeCSEL Workshop (2013), p. 31.

Ouvrard et al., "Single-Frequency Tunable Sb-Based VCSELs Emitting at 2.3 μm," IEEE Photonics Technology Letters (2005), 17(10), pp. 2020-2022.

Paquet et al., "Vertical-External-Cavity Surface-Emitting Laser for THz Generation," 39th International Conference on Infrared, Millimeter, and Teraherz Waves, IEEE (2014), pp. 1-2.

Paquet et al., "Dual-Frequency Vertical-External-Cavity Surface-Emitting Laser for Terahertz Generation," Proceedings of the 2nd VeCSEL Workshop (2015), p. 33.

Sellahi et al., "Generation of New Spatial and Temporal Coherent States Using VECSEL Technology: VORTEX, High Order Laguerre-Gauss Mode, Continuum Source," Proceedings of the International Society for Optical Engineering, SPIE (2014), vol. 8966, pp. 89660U1-89660U7.

Wichmann et al., "Systematic Investigation of Single- and Multi-Mode Operation in Vertical-External-Cavity Surface-Emitting Lasers," Proceedings of the International Society for Optical Engineering, SPIE (2014), vol. 8966, pp. 89660N1-89660N6.

Yazdanypoor et al., "Optimizing Optical Output Power of Single-Mode VCSELs Using Multiple Oxide Layers," IEEE Journal of Selected Topics in Quantum Electronics (2013), 19(4), pp. 1701708-1-1701708-8.

\* cited by examiner

DUAL-FREQUENCY VERTICAL-EXTERNAL-CAVITY SURFACE-EMITTING LASER DEVICE FOR THZ GENERATION AND METHOD FOR GENERATING THZ

BACKGROUND

The present invention relates to Vertical External Cavity Surface Emitting Laser devices (VeCSEL), and more specifically to the generation of two stabilized transverse modes with such devices.

The field of the invention is, but not limited to, semiconductor laser tera-Hertz (THz) sources and its applications.

THz waves cover the electromagnetic spectrum between the microwave and infrared. The domain of application is very wide with some promising applications, as for example in astronomy, radar systems, time-frequency metrology, bio-medical sensing and imaging, high-data-rate wireless communications or security. A large variety of solutions exist for THz emission, from optics to electronics, but existing solutions are often cumbersome or limited in terms of output power, coherence, tunability and/or modulation bandwidth: at the upper band of the THz spectrum, sources are usually pulsed and/or require low-temperature operation; and at the lower band of the THz spectrum, electronic-based sources usually operate easily at room temperature in a continuous-wave operation, and at a fixed frequency of emission. Moreover, frequency-multiplied sources offer enhanced tunability but do not provide simultaneously sufficient output power and high modulation bandwidth, compactness, or affordability.

Different techniques are implemented to generate THz waves, summarized into two categories:

The first one consists in two lasers setup, with photo-mixing experiments, for which the frequency difference between the two sources is widely tunable. In the other hand, as it uses two distinguish sources, it will be sensitive to the drift effects of both of them and thus the beating stability is weak.

The second one consists in a two modes laser: in this case the frequency difference is inherently more stable because the two modes will be sensitive to common effects and there will drift in a similar manner.

Many well-known attempts to reach compact, stable, continuously-tunable, coherent and powerful dual-frequency lasers have been already proposed for terahertz generation, but none of them meets fully those requirements.

One of them is used to reduce mode coupling and consists in a separation of laser beams within a two-axis cavity. It shows some greats results in terms of tunability and coherence. However, tunability occurs by steps, output power is limited to few milliwatts, cavity is complex with intra-cavity movable elements, almost impossible to integrate on a single device, and coherence is degraded.

Another technique is the external-cavities diode laser using spectral filter(s) that can provide dual-frequency stability, but to the detriment of output power, cavity complexity, alignment sensitivity/robustness, beam quality, and coherence as the laser tends to operate two sets of longitudinal modes rather than two modes.

Vertical External Cavity Surface Emitting Laser devices (VeCSEL) are well known devices and are very promising solutions for dual-frequency lasers as they are inherently compact, wavelength flexible, widely tunable, powerful and highly coherent (spectrally, spatially and also in terms of polarization).

Dual-frequency laser operation based on the coexistence of two longitudinal modes for THz generation in a VeCSEL has already been described in M. Wichmann et al. "*Systematic investigation of single and multi-mode operation in vertical-external-cavity surface-emitting lasers*", Proc. SPIE 89660N, but such design does not allow for simultaneous operation of both laser lines.

Other VeCSEL demonstration is described in Gaya Baili et al., "*Experimental demonstration of a tunable dual-frequency semiconductor laser free of relaxation oscillations*", Optics Letters, Vol. 34, Issue 21, pp. 3421-3423 (2009). It deals with the use of a VeCSEL in the GHz range and based on dual polarization beam with intracavity beam splitting on the gain chip.

The aim of the present invention is to fulfil the previously mentioned problems and further to lead to some over advantages.

It is an object of the invention to provide stable and robust/controlled lasing effect of two transverse modes within a single cavity.

It is another object of the present invention to provide laser sources achieving a very high stability (i.e. high coherence or low phase noise) of the beating frequency.

It is another object of the present invention to provide laser sources achieving high-power operations with good coherence and good stability.

It is another object of the invention to provide laser sources achieving continuously or fine tunability over a broad frequency range.

It is another object of the invention to provide compact laser sources operating at room temperature in continuous wave.

SUMMARY

Such objects are accomplished with a laser device for generating an optical wave comprising at least two frequencies, such laser device comprising:
- a first element comprising a gain region located between one first end defined by a first mirror and a second end defined by an exit region,
- a second mirror, distinct from the first element, and arranged so as to form with the first mirror an optical cavity including the gain region and a gap between the exit region and the second mirror,
- means for pumping the gain region so as to generate the optical wave,
- the laser device further comprises means for shaping the light intensity and/or phase profile of the optical wave and arranged for selecting at least two transverse modes of the optical wave, especially Laguerre-Gauss modes.

In a preferential embodiments, means for shaping the light intensity may comprise at least one mask, each mask being patterned with a surface having a non-uniform absorbance, said surface including at least one absorbing area and/or at least one transmitting area; means for shaping phase profile of the optical wave are arranged for adjusting the at least two transverse modes of the optical wave and comprise at least one photonic crystal and/or diffraction grating located at least at one end of the gain region and patterned in order to shape the transverse phase and/or the transverse intensity of the optical wave, in order to select at least two transverse modes.

Alternatively the (any) gain region may be an element distinct from the second mirror.

In a more general way, the number of stabilized emitted frequencies of the laser according to the invention corresponds with the number of selected transverse modes.

In some embodiments of the inventions, the means for pumping the gain region may include optical and electrical means. The first element may be a half-VCSEL type semiconductor element, or any other type of Laser in which transverse modes are able to resonate inside the cavity. The laser device according to the present invention takes benefits from the VeCSEL structures in terms of output power, stability and robustness. Moreover, the use of a half-VCSEL makes it possible to use the laser device according to the present invention at room temperature and in continuous wave operation, which greatly simplify its use and makes it more versatile. The intrinsic optical qualities of the cavity are very good and very suitable for such applications: the optical losses are low and there is no amplified spontaneous emission, which leads to highly coherent wave. Lastly there is no non-linear and complex dynamic behavior; and the frequency may be continuously tuned over a very broad frequency range because there is non gain and no cavity mode coupling. Thus it is possible to generate a dual-frequency highly coherent laser based on the stabilization of two transverse modes in the VeCSEL single-axis cavity.

In particular, the at least two optical wave selected transverse modes of the present invention may be chosen between (i) the stabilized Laguerre-Gauss modes, and/or (ii) the stabilized Hermite-Gauss modes, and/or (iii) the stabilized Bessel-Gauss modes or any lasing state: other transverse cavity mode basis (light eigenstates)—or unstable laser cavity modes—may be used, as soon as they can be generated simultaneously.

In a more general way, means for spatially filtering the optical wave may be chosen between (i) means for diffracting light, (ii) means for diffusing light and (iii) means for absorbing light. In some other embodiments of the present invention, means for spatially filtering the optical wave may be located at an anti-node of the stationary longitudinal field inside the cavity.

In a preferred embodiment, means for absorbing light may comprise one single mask, said mask being patterned for selecting the at least two transverse modes of the optical wave.

As it will be described hereafter, the previously mentioned means for absorbing or diffracting light may be integrated onto the semiconductor element. Thus, there is no alignment procedure, and no mechanical noise may be introduced by vibrations. Thus, the present invention allows stabilizing the resonating modes inside the cavity by selecting those transverse modes isolated and preventing from coupling with some undesired modes: the laser source according to the invention provides a very high stable beat frequency.

In another preferred embodiment, each mask may be few nanometer-thick layer or sub-wavelength thick layer.

In another preferred embodiment, the absorbing area provides an absorbance at least twice higher than the absorbance of the transmitting. In some other embodiments, the transmitting areas may provide more than 99% transmittance, and the absorbing areas may provide between 5% to 100% absorbance.

In another preferred embodiment, each mask may be located at an anti-node value of the optical wave inside the cavity, or close to the said anti-node value.

In another mode of realization compatible with any mode of realization of the invention, means for shaping longitudinal phase profile of the optical wave may present a non-uniform transverse gain distribution inside the optical cavity, in order to transversally modulate the intensity of the emission wavelength gain and to adjust the frequency difference between the at least two transverse modes of the optical wave.

In particular, means for shaping longitudinal phase profile of the optical wave may further comprise at least a transversally non-uniform losses mask between the two modes in order to adjust the frequency difference between the two modes by locally adjusting the injected charge carriers in the gain region to modify the emission wavelength gain on these regions.

Eventually, the precise adjusting of the transverse modes oscillating inside the optical cavity can be achieved by a mean for shaping phase profile comprising a heat source arranged to generate inside the optical cavity a non-uniform transverse heat distribution, thus to determine and control the frequency difference between the at least two transverse modes of the optical wave.

Preferentially, alternatively or additionally, the mean for shaping phase profile of the optical wave may comprise a spectral filter presenting a non-uniform optical wavelength along its transverse section in order to adjust the frequency difference between the at least two transverse modes of the optical wave. In a more general way, means for shaping phase profile may be patterned in order to modify the refractive index "vu" by the optical wave and by at least one of the transverse modes oscillating in the optical cavity. As the refractive index is especially correlated to the temperature, the pressure and the humidity of the optical wave crossed medium, said means may comprise a temperature, pressure, and/or humidity adjusting mean of at least a partial path of the optical wave inside the optical cavity.

In this particular case, the mean for shaping phase profile may comprise a heating mean of at least a part of the optical cavity, by means of, for example an electrical resistance nearly disposed, in order to spread thermal energy by thermal conduction and/or convection and/or radiation.

In the case where the mean for spatially filtering comprise a bi-dimensional micro-etching network (i.e. a photonic crystal), the characteristic dimensions, such as the diameter and their repetition pattern, can be adjusted in order to generate a predetermined transverse profile of the optical wavelength of said spatially filtering mean and a phase shift of each transverse mode oscillating in the cavity, allowing to fix a frequency difference value between said at least two transverse modes.

This configuration allows advantageously determining any phase profile by varying one and/or the other dimension of the network. This variation may be monotonous or not, continuous or discontinuous: it is possible to control precisely the filtering issued by the dimension variation of micro-cavities network.

Preferably, the spectral filter may comprise furthermore a mean for dynamic control of the optical wavelength transverse profile of said spectral filter, such as a controllable crystal liquid pixel matrix: it is possible to control, during the device operating, the frequency difference between the two transverse modes, in order to vary it and/or control it for its stabilization.

In one another mode of realization compatible with any of the above improvements, the means for pumping the gain region may comprise (i) a pump laser emitting a pumping laser beam and (ii) means arranged for spatially shaping the pumping laser beam intensity; and means for selecting at least two transverse modes of the optical wave may comprise the means for spatially shaping the pumping laser beam intensity and are arranged to project a pumping beam intensity pattern onto the exit region of the first element corresponding with the at least two selected transverse modes of the optical wave.

Thus, it is possible to control the laser according to the invention in order to adjust precisely the at least two transvers modes oscillating in the optical cavity and the frequency difference between the said at least two transverse modes.

In one another mode of realization, the second mirror may be a concave mirror or a phase conjugator mirror.

In one another mode of realization, a spectral filter may be inserted inside the cavity, onto the surface of one of the mirrors, or into the gap.

In a preferred embodiment, the laser device according to the invention may further comprise tuning means for moving the second mirror so as to change the length of the optical cavity. Thus it is possible to adjust the laser mean frequency by moving the external mirror. This could be achieved with any well-known means, such as piezoelectric actuators for example, or by adjusting the temperature of the semiconductor thanks to the Pelletier module above its substrate. This would provide an increasing of the overall temperature through a homogeneous manner.

In another mode of realization, the laser device according to the invention may further comprises means for tuning the frequency difference between the at least two modes of the optical wave.

In a preferred embodiment, means for tuning the frequency difference may be thermal tuning means arranged to establish a thermal gradient into the transverse direction of the semiconductor element. Thermal tuning is a very fine mean for changing the optical cavity temperature (i.e. optical path length) and thus, is it can be achieved with the present embodiment some very fine frequency shifts: the laser device according to the invention is able of continuously tenability.

In another preferred embodiment, the means for thermal tuning may comprise one of the following components:
- at least one local thermal conducting element transversally mounted on the semiconductor element and arranged to conduct or dissipate heat, and/or
- means for modulating a pump laser power in order to heat, and preferentially locally heat:
  the exit region of the semiconductor element, and/or
  the means for spatially filtering, and/or
- a shaped pump beam that enhanced/optimized the thermal gradient, or the non-homogeneous transverse thermal distribution across the two beams, with a petal-like pump intensity beam laser profile for example.

It's an another aspect of the invention to propose a method for generating an optical wave comprising at least two frequencies and comprising at least one of the following steps: (i) generating an optical wave inside a gain region, (ii) pumping the optical wave with means for pumping and (iii) shaping the light intensity and/or phase profile of the optical wave for selecting at least two transverse modes of the optical wave.

In a preferred embodiment, the step of selecting the at least transverse modes of the optical wave may consist in spatially filtering the optical wave intensity.

In one another preferred embodiment, the method according to the invention may further comprise a step of according the length of the optical cavity in order to shift the at least optical wave frequencies.

In one another preferred embodiment, the method according to the invention may further comprise the step of tuning the frequency difference between the at least two modes.

It's another aspect of the present invention to propose the utilization of the laser device according to the invention for THz generation with photomixing techniques, wherein the at least two modes selected are injected into a waveguide.

BRIEF DESCRIPTION OF THE DRAWINGS

The methods according to embodiments of the present invention may be better understood with reference to the drawings, which are given for illustrative purposes only and not meant to be limiting. Other aspects, goals and advantages of the invention shall be apparent from the description given hereunder.

While this invention has been described in conjunction with a number of embodiments, it is evident that many alternatives, modifications and variations would be or are apparent to those of ordinary skill in the applicable arts. Accordingly, it is intended to embrace all such alternatives, modifications, equivalents and variations that are within the spirit and scope of this invention.

DETAILED DESCRIPTION

Hereafter, the adjective "longitudinal" refers to the direction that corresponds with the one of the optical wave 107 propagation or the cavity axis. The adjective "transverse" refers to an orthogonal direction to the longitudinal one.

In the following descriptions, the first element 111 is considered to be a semiconductor element, without limiting the present invention.

General Mode of Realization

Figure 1:
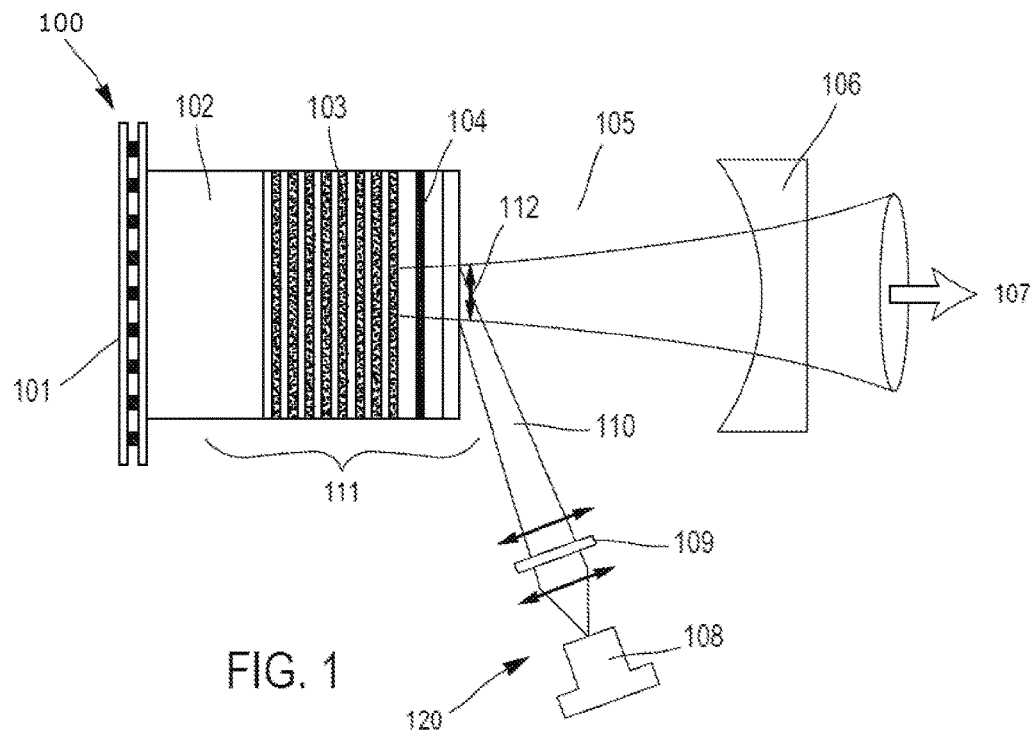
FIG. 1 describes a schematic view of the dual-frequency laser according to the invention.

With reference to FIG. 1, a general mode of realization of the present invention is described. This mode allows stable and compact laser modules, working at room temperature, with robust and stabilized dual-frequency transverse modes and -tunable.

The present invention is based on a well-known VeCSEL and integrates functionalities using III-V technologies and external concave-type optical cavity.

VeCSEL technology comprises basically a semiconductor element with a gain medium for generating the optical radiation and a first mirror 103. The gain medium may comprise for instance quantum wells or quantum dots and it may be electrically or optically pumped. The first mirror 103 may comprise a succession of layers constituting a Bragg grating which reflects the optical waves 107. The semiconductor element is mounted on a heat sink with Pelletier modules for stabilizing and controlling the temperature.

The following table illustrates the layers that are constitutive to the half-VECSEL in a first mode of realization:

| Description | Thickness A |
|---|---|
| InGaP cap layer | 350 |
| GaAs | 150 |
| AlAs | 300 |
| GaAs | 919 |
| GaAsP | 286 |
| PQ InGaAs | 80 |
| GaAsP | 286 |
| GaAs | 479 |
| GaAsP | 286 |
| PQ InGaAs | 80 |
| GaAsP | 286 |
| GaAs | 479 |
| GaAsP | 286 |
| PQ InGaAs | 80 |
| GaAsP | 286 |
| GaAs | 1964 |
| GaAsP | 286 |
| PQ InGaAs | 80 |
| GaAsP | 286 |
| GaAs | 1964 |
| GaAsP | 286 |
| PQ InGaAs | 80 |
| GaAsP | 286 |
| GaAs | 3449 |
| GaAsP | 286 |
| PQ InGaAs | 80 |
| GaAsP | 286 |
| GaAs | 3952 |
| AlAs | 873 |
| GaAs | 733 |
| AlAs | 873 |
| GaAs-N+ | |

Many other configurations may be developed, with different kind of layer, with many some others materials and other width. The present invention intends to cover all those solutions.

The Bragg mirror has a high reflectivity, higher than 99% or greater than the output mirror; for example, it may be constituted with 27.5 pairs of AlAs/GaAs quarter wave layers.

The gain region 104 is, for example, made with six strain-balanced InGaAs/GaAs(P) Quantum Wells located at the anti-node of the laser field in the cavity. The total optical thickness of the active region from Bragg to air is 13/2 half-wave layers.

Such semiconductor element is fabricated thanks to well-known semi-conductors fabrication technologies, such as Semiconductor MBE epitaxy, electronic lithography, dry etching and wet etching.

A second external mirror with a concave shape is provided and arranged so as to form an external optical cavity with the first mirror 103 and to stabilize some transverse modes. It is noted that the present invention may be able to stabilize Laguerre-Gauss modes and/or Hermite-Gauss modes and/or Bessel-Gauss modes and would be compliant with the present invention.

The external optical cavity is called "external" because it comprises a part which is distinct from the semi-conductor element. It doesn't need any extra component inside for the proper operation of the laser. Preferentially, its external part is filled with air, but in some other embodiments, the optical cavity of the laser device 100 according to the invention may include a solid spacer between the exit region and the second mirror 106 in order to form a monolithic cavity. As an example, such monolithic cavity could be made with a Saphir monolith or with glass.

In a preferred embodiment, the external cavity has an axial symmetry.

The second mirror 106 may be a dielectric glass based mirror or may have some photonic crystals on semiconductor or etched surface. It has a few percent of transmittance so as to allow the laser beam to exit the laser. Typically, the second external mirror is located at 1 mm from the semiconductor element, and it has a radius of curvature of about 10 mm. In the example illustrated in FIG. 1, an air gap 105 separates the concave shaped external mirror from the semiconductor element.

Then, an optical pumping is used to raise electrons from low energy levels to some higher ones thanks to a single-mode laser diode. As an example, the wavelength may be 785 nm and the output power 300 mW. The pumping laser beam 110 is the focused onto the half-VECSEL surface in order to provide a 50-100 µm spot-size.

The VeCSEL has been designed in order to generate a stable laser state exhibiting at least two transverse modes, where each transverse mode operates on a single longitudinal mode with a linear polarization state, thus at a well-defined single frequency state.

The tuning capabilities of the laser device 100 according to the invention are detailed hereafter.

Figure 2:
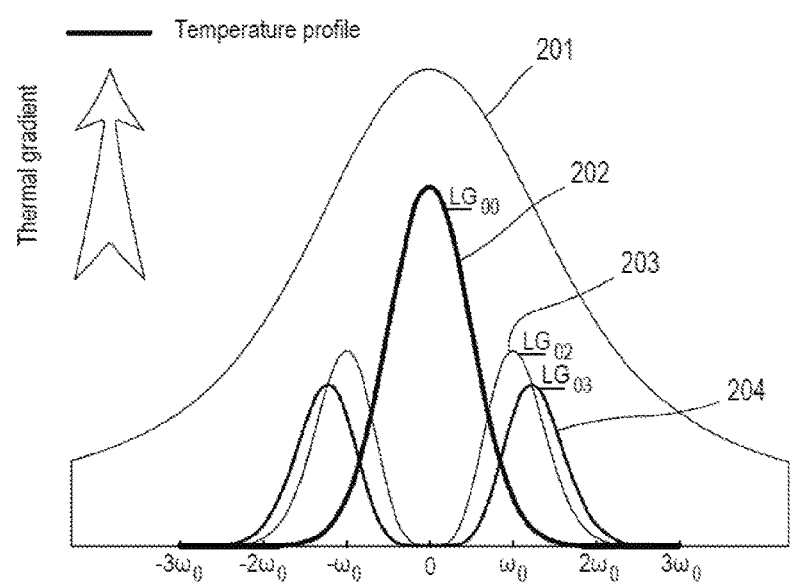
FIG. 2 is a diagram of the transverse temperature profile that could be measured inside the semiconductor element.

FIG. 2 illustrates the temperature transverse profile 201 that could be measured inside the semiconductor element 111 and the intensity of some Laguerre-Gauss (LG) transverse modes 202, 203 and 204. The temperature transverse profile is Gaussian and the modes LG00 202, LG02 203 and LG03 204 are represented. The beat frequency between the two transverse LG modes relies on thermal effect, and more precisely on the radial thermal gradient 201 generated by the optical pumping: as the pump beam is focused on the half-VCSEL with quantum efficiency defect, a radial thermal gradient is generated.

Therefore, mean wavelength of the semiconductor gain spectrum is shifted accordingly to this gradient at a rate of typically 100 GHz/K. As a consequence, frequency difference between transverse modes depends on the heat spatial distribution (or modal temperature) and the more confined mode observes the highest wavelength of operation. Tuning the optical pump power thus allows tuning the beat frequency.

Figure 3:
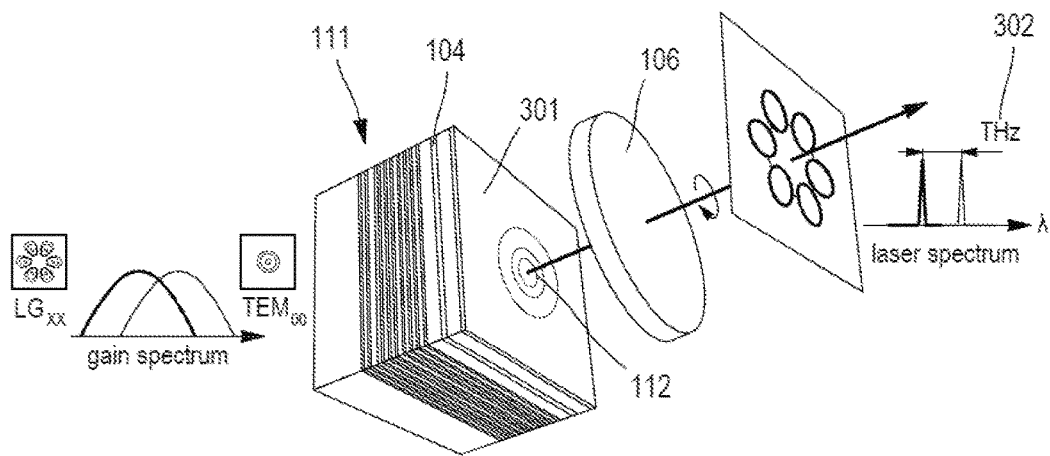
FIG. 3 is a schematic representation of the thermal tuning over the semiconductor element.

FIG. 3 is a schematic representation of the thermal tuning over the semiconductor element 111. The pumping laser beam 110 focused onto the top surface 112 of the semiconductor element 111 induces a thermal gradient 301. Thus, the refractive index is spatially dependent inside the cavity, and may be different between two axial paths (e.g. two modes).

Thus it allows existing more than one single frequency 302, and one is able to tune the frequency difference between the two modes by simply tuning the temperature of the gain region 104. As controlling the temperature can be achieved continuously, tuning the frequency beat can be also achieved continuously by thermal tuning.

The thermal tuning may be achieved by any means and any methods.

In one preferred embodiment, thermal tuning is provided by the optical pumping laser beam 110. By controlling the power of the pumping laser beam 110, one can control the temperature diffusion inside the semiconductor element. Thus it is possible to locally modify the heat conduced inside the semiconductor element in order to control the thermal gradient.

In one another preferred embodiment, the thermal pumping can be realized thanks to local metallic heater deposited onto the surface of the semiconductor element. Some thin-film metal layers are transversally patterned in order to generate a thermal gradient when heating.

Figure 4:
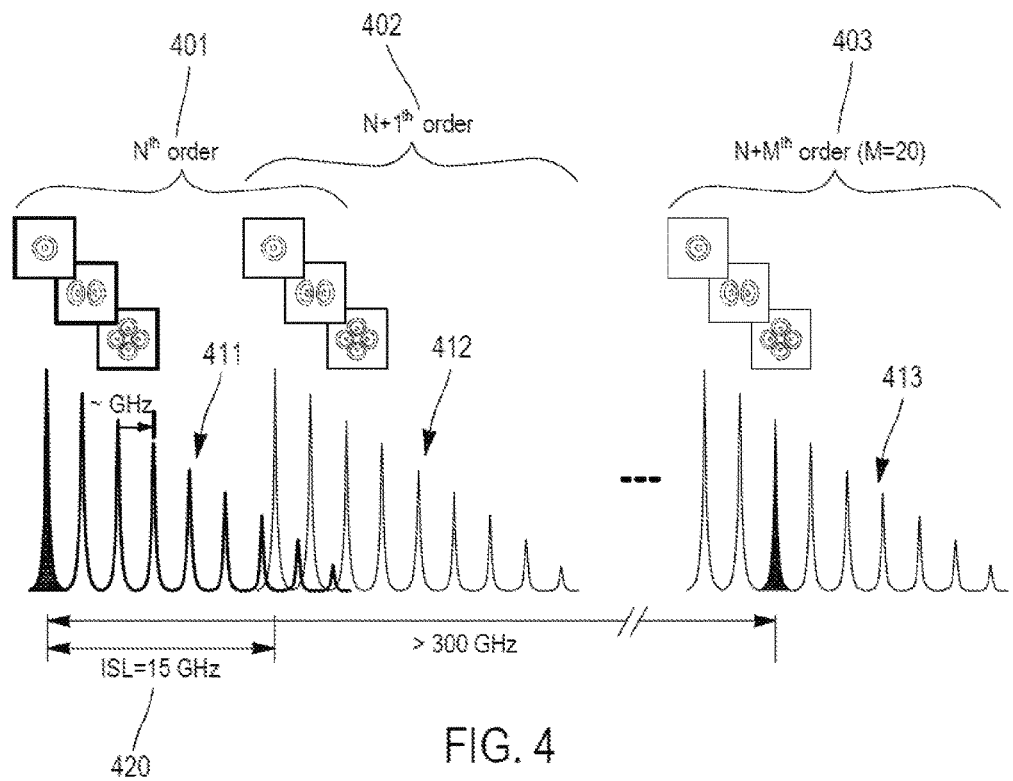
FIG. 4 is a schematic view of the optical transmission spectra for a dual-frequency VeCSEL device.

FIG. 4 depicts a schematic view of the optical transmission spectra for a dual-frequency VECSEL device. Because of its intrinsic characteristics, the transverse modes have different resonance frequencies that are located in some quite distinguish frequency domains 401, 402 and 403. Thus, as it's illustrated on FIG. 4, the $N^{th}$ order mode 401 is located on the left side of the spectra, while the $N+1^{th}$ and the $N+M^{th}$ orders 402,403 are located on the right side. Thus, for each order, the Laguerre-Gauss transverse modes exist in a frequency comb 411, 412, 413 that is separated from the next order from about the Free Spectral Range 402 plus the Guoy shift difference. Switching between those frequency combs may be achieved by tuning the cavity length. Nevertheless, this kind of tuning doesn't affect the beat frequency.

Nevertheless, such operation is not sufficient for stable dual-frequency operation: transverse modes operation has to be robust and stabilized in order to avoid transverse modes hops and alignment sensitivity. To achieve this, the present invention proposes the breakthrough solution that consists in means for shaping the light intensity and/or the light phase of the optical wave 107 that is resonating inside the optical cavity in order to select two transverse modes and avoid the apparition of some other deleterious transverse modes.

In some first embodiments, the means for shaping the intensity may be means for spatially filtering the optical wave 107 of the resonator. It may be for example at least on mask located onto or inside the semiconductor element 111—preferentially at an anti-node of the laser field—and with a specific shape in order to provide some first areas though which the optical wave 107 may be transmitted, and some other areas through which the optical wave 107 propagation may be mainly stopped. In other terms, the transverse spatial filter according to the invention induces some strong losses for undesired cavity modes and low losses for the desired modes.

It includes all kind of light-filtering devices, as for example diffracting devices, diffusing devices and absorbing devices. Two different modes of realization for spatially filtering will be described hereafter. In a preferred embodiment, those devices may be fabricated by Metal Organic Chemical Vapor Deposition (MOCVD) and e-beam lithography, but the present invention is not limited to this fabrication process.

In some other embodiments, means for shaping the intensity of the optical wave 107 inside the resonator may be an intensity-patterned laser beam pumping device.

Thus, the laser device 100 according to the invention is highly accordable and stable: as the beat frequency tuning relies on thermal effects, tunability can be adjusted in some extend by a control of the temperature gradient inside the semiconductor element, e.g. by a control of the pumping laser beam 110 power and/or some additional heaters onto the semiconductor element.

First Mode of Realization: Absorbing Masks

In the following descriptions, the devices according to the mode or realization of the present invention are suitable for filtering the Laguerre-Gauss transverse modes.

Figure 5:
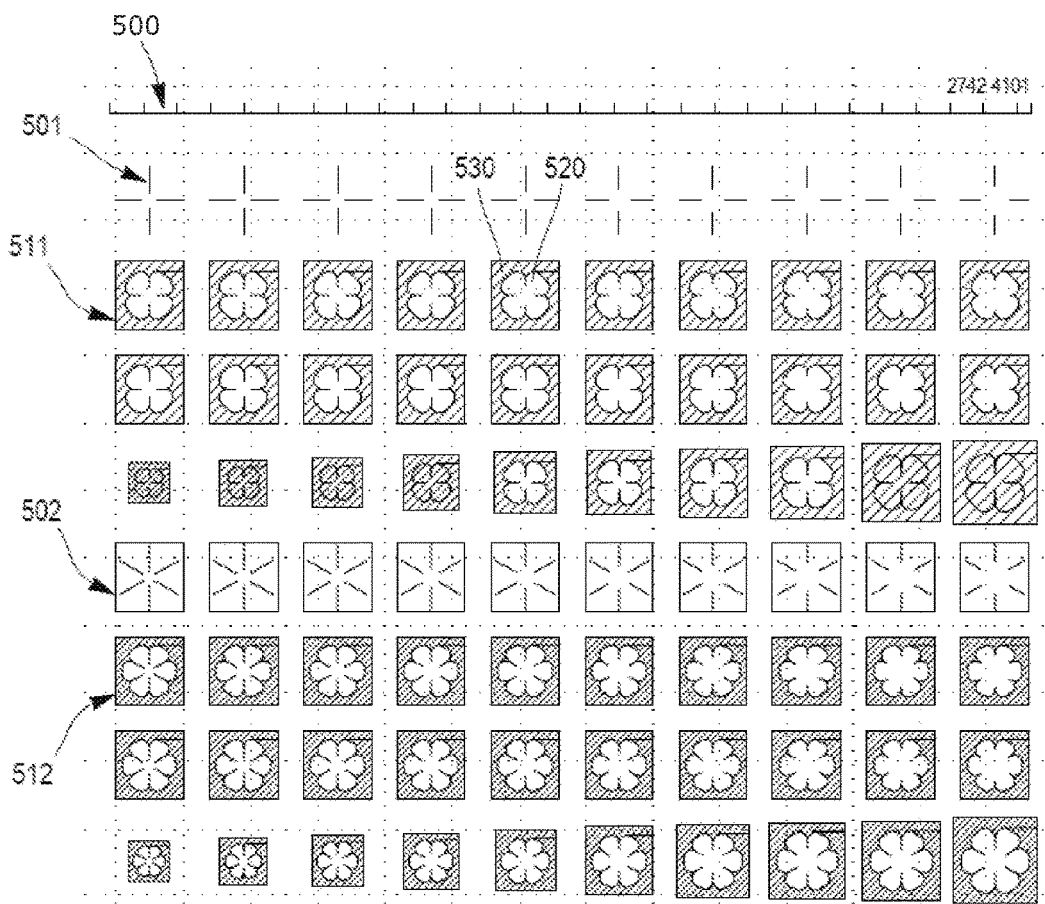
FIG. 5 is an example of file with mask designs used for fabricating masks according to the invention by e-beam lithography.
Figure 6:
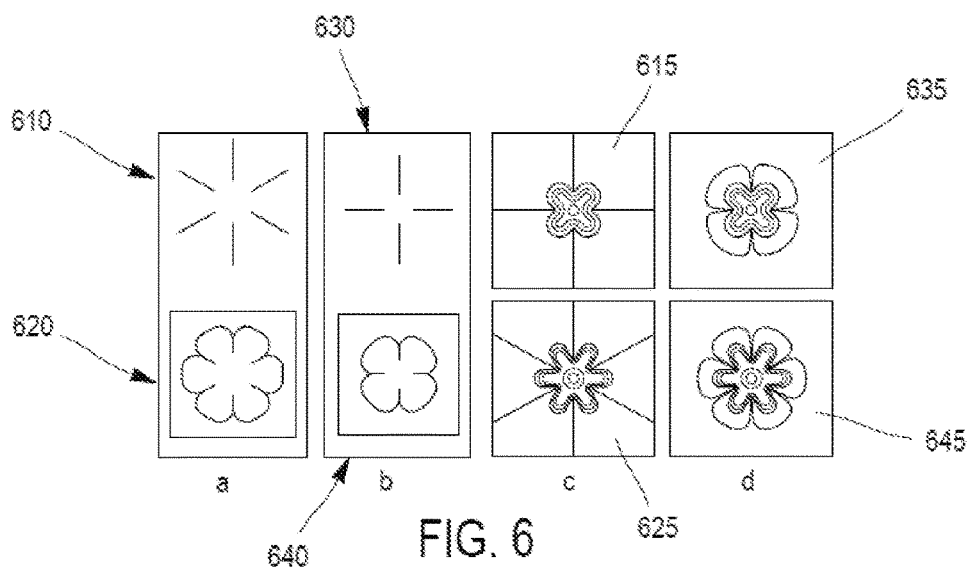
FIG. 6 is an optical microscope picture of metallic Chrome absorbing masks according to the invention.
Figure 7:
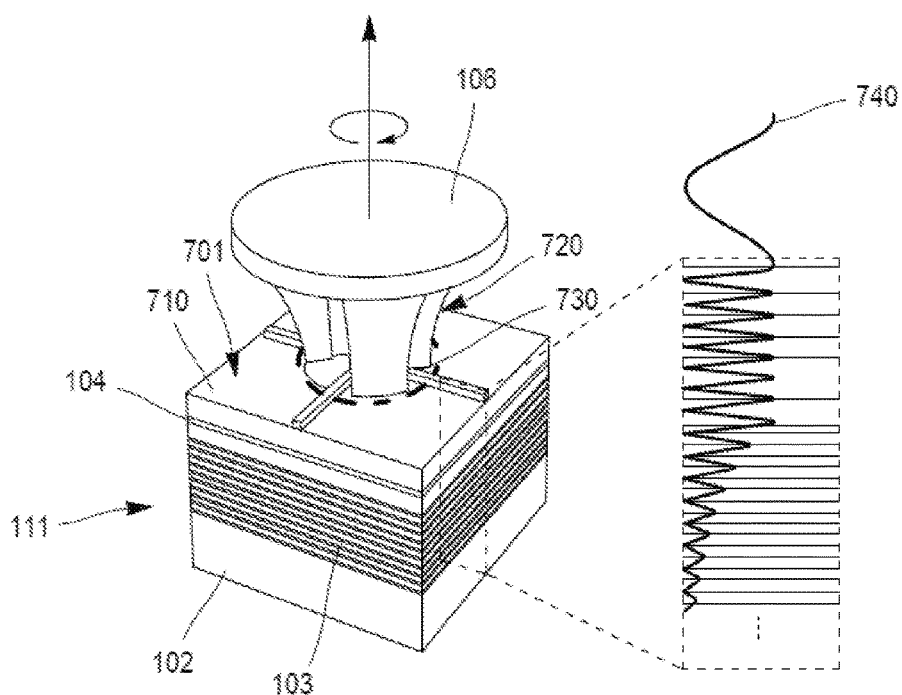
FIG. 7 is a schematic view of a laser device according to the invention with a metallic absorbing mask located onto the semiconductor element.

In reference to FIG. 5, FIG. 6 and FIG. 7, a sub-wavelength patterned absorbing layer is described. The overall dimensions are suitable with the semiconductor element, as it may be deposited onto its top surface.

In a preferred embodiment, the patterned absorbing layer may be deposited at any location inside the cavity, between the first mirror 103 and the exit region.

It's composed with some absorbing area 530 and some transmitting area 520. Typically, the intensity of the undesired transverse modes of the optical wave 107 that is resonating inside the cavity may be absorbed between 5% to 100% by the absorbing areas 530, while the transmitting areas 520 tend to reduce losses as much as possible, and typically less than 1%.

The shapes of those areas are designed in order to fit with the transverse pattern of the transverse modes that are sought to be selected.

The FIG. 5 illustrates a file used to lithography a wafer 500 for designing the laser device 100 according to the present invention and integrating on the top surface of the semiconductor element 111 a spatial filter. Many kind of design are patterned onto the wafer, with some different dimensional specifications. Some of them are bigger than others in order to optimize the transverse modes selection, depending on the beam size and the pumping laser beam 110. Moreover, there are two kind of design: some simple ones 501, 502, made with some lines in a cross shape 501 or star shape 502, or some more sophisticated flower-shaped design 511, 512. For one kind of transverse mode order filtering, those design are mainly equivalent. It allows filtering some different order of transverse modes.

For example, the FIG. 6 illustrates an optical microscope picture of metallic Chrome masks 610, 620, 630, 640 according to the invention and the corresponding Laguerre-Gauss transverse modes obtained by simulation with such filters 615, 625, 635, 645 respectively.

Picture 6.a and 6.b illustrate some metallic masks 610, 620, 630, 640 for two different orders of transverse Laguerre-Gauss modes. On picture 6a and respectively 6.b, the cross design 610, 630 and the flower-shaped design 620, 640 are equivalent, as it can be observed onto picture 6.c and 6.d respectively. More precisely, pictures 6.c and 6.d illustrate the corresponding LG transvers modes that may be obtained with those absorbing masks: the 610 and 620 designed mask allows isolating modes LG00+LG02 (615 and 625) while the 630 and 640 designed mask allows isolating modes LG00+LG03 (635 and 645).

Mask design for dual-frequency laser operation are designed in regard to some physical parameters. Knowing the cavity optical parameters, Laguerre-Gauss modes can be calculated. Many of these modes cannot reach lasing operation since the Gaussian pump beam is focused at the center of the structure, thus allowing existence of low-order transverse modes only. Given mask geometry, loss can be calculated for each Laguerre-Gauss mode and lowest losses should be obtained for chosen modes $LG_{00}$ and $LG_{02}$ for example. Thanks to their quite-complementary transverse distributions, these two modes should coexist due to transverse spatial hole burning.

The present invention covers all the configurations for stabilizing/isolating at least two transverse modes: one mask may be able to isolate one, two or more transverse modes. As it will be described in FIG. 8, two masks 820, 830 may be combined in order to each isolate at least one different transverse mode.

Typically, the mask is formed by the deposition of a 10 nm thick and few microns width Chrome layer on the half VeCSEL. The specifications for transverse dimensions are about few microns, depending on the beam diameter, and along the longitudinal dimensions, masks must be thin enough in order not to absorb transverse modes that are sought to be propagated inside the cavity. It must be thin enough not to make the light diffracting. 10 nm thick is an optimum for Chromium for example, but it depends on the absorption coefficient of the material. In a more general way, the thickness is lower than the wavelength of the corresponding optical wave 107.

Then, in a preferred embodiment, the mask is deposited at anti-node of the optical wave 107 that is resonating inside the optical cavity. Deposition material is not limiting the present invention. Depending of applications, technologies wavelength and/or performances sought, one could deposit some metallic material, doped semiconductor material, or chemically attacked material and/or some dielectric.

FIG. 7 illustrates the implementation of such an absorbing mask 710 according to the invention, onto the top surface 701 of a half VeCSEL 111. Thanks to the absorbing areas and the transmitting areas, two transverse modes 720, 730 are selected and—finally—are stabilized inside the laser optical cavity thanks to transverse spatial hole burning in the gain region 104. Those modes are resonating between the Bragg mirror 103 located inside the semiconductor element 111 and the second external concave mirror 106. On the right of the figure, a diagram is illustrating the field intensity propagation 740 inside the cavity: it shows the propagative wave inside the Bragg grating mirror and resonating through the active zone and the gain region 104 under optical pumping.

Figure 8:
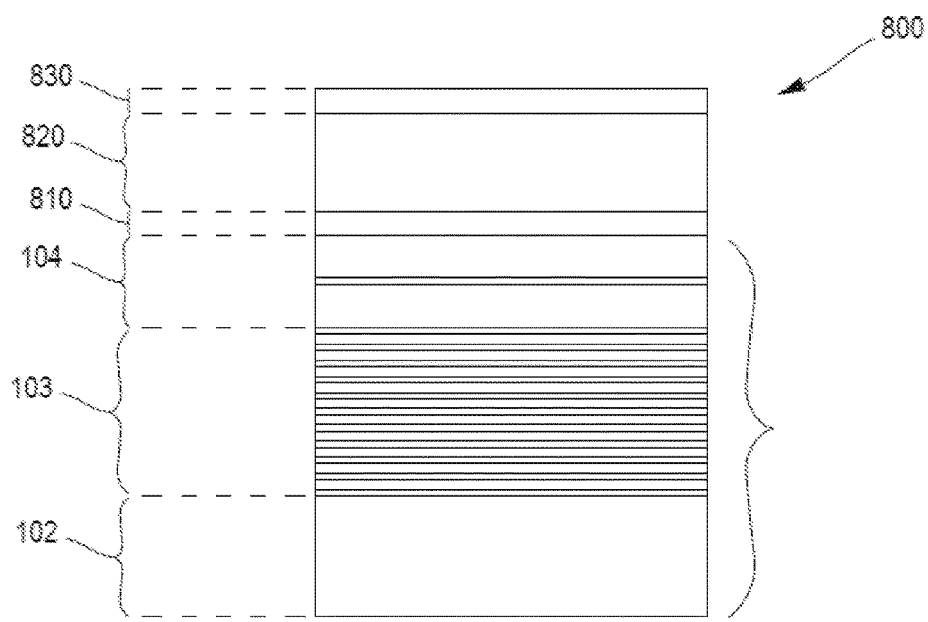
FIG. 8 is a schematic view of a laser device according to a second embodiment of the invention with two metallic absorbing masks with a spacer located onto the semiconductor element.

FIG. 8 illustrates a schematic view of a laser device 800 according to another embodiment of the invention with two metallic masks 820, 830. Each mask is deposited one after the other. First the Bragg mirror 103 is deposited over the substrate 102. Then the active area with the gain region 104 is deposited and lithographed onto the Bragg mirror. Then, a first mask 810 with a first design is deposited onto the surface, in the example illustrated; it's a 10 nm thick Chrome mask. Then a spacer 820 is deposited with a thickness that is wavelength-dependent. In the example illustrated, the thickness is the half of the wavelength. Then, a second absorbing metallic mask 830 with a second design that may be different from the first one is deposited onto the spacer.

In a preferred embodiment, each mask is located on an anti-node of the optical wave 107 that is generated by the present laser device.

Thus it's possible to transverse spatially filtering the transverse Laguerre-Gauss modes thanks to a combination of two absorbing masks.

Figure 9:
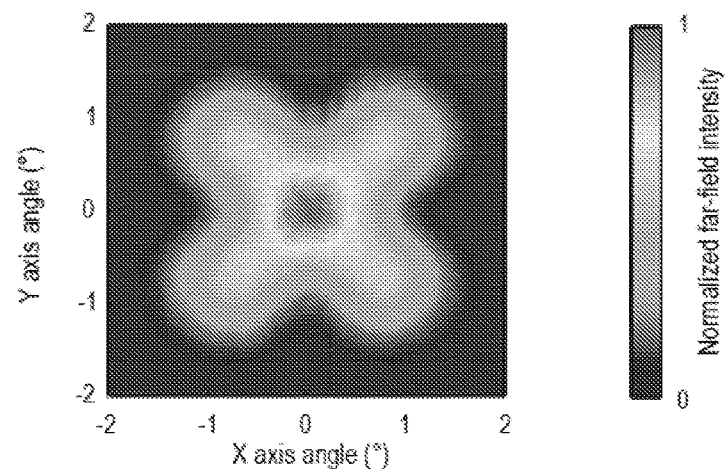
FIG. 9 is a far-field intensity map of the laser device according to the invention.
Figure 10:
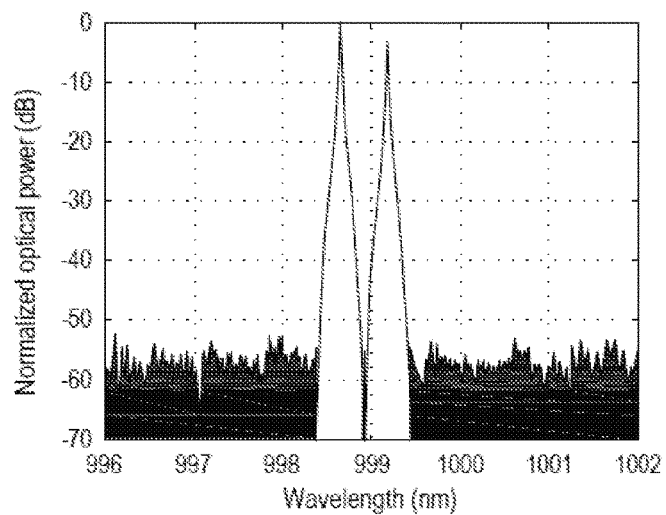
FIG. 10 is the measured optical spectrum of the laser device according to the invention.

FIG. 9, shows the far-field intensity map of the laser according to the invention with an integrated metallic absorbing mask and illustrates that both the two Laguerre-Gauss modes coexist: the laser device 100 according to the invention FIG. 10 is the optical spectrum of the laser according to the invention. It illustrates that the laser according to the present invention provides a dual-frequency operation, illustrated by the two extrema plotted with a frequency difference between the two modes of 162 GHz. By changing the absorbing mask designs, it's possible to change the beat frequency up to 450 GHz.

Figure 11:
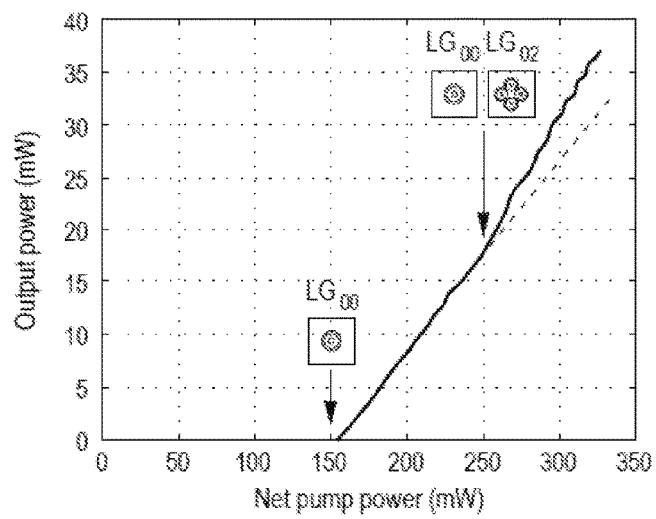
FIG. 11 is a graph of the laser output power as a function of the optical pumping power.

FIG. 11 is a graph on which the laser output power is plotted as a function of the optical pumping power. After a threshold value for the first transverse mode, the laser output power is linear with a first slope until the threshold value for the second transverse mode from which the slope of the laser output power is increased: the laser according to the invention becomes more efficient while the second mode appears. On the example illustrated in FIG. 11, the threshold value for the first mode is around 150 mW of the pump power, and the threshold value for the second mode is around 250 mW.

Second Mode of Realization: Diffracting Masks

Figure 12:
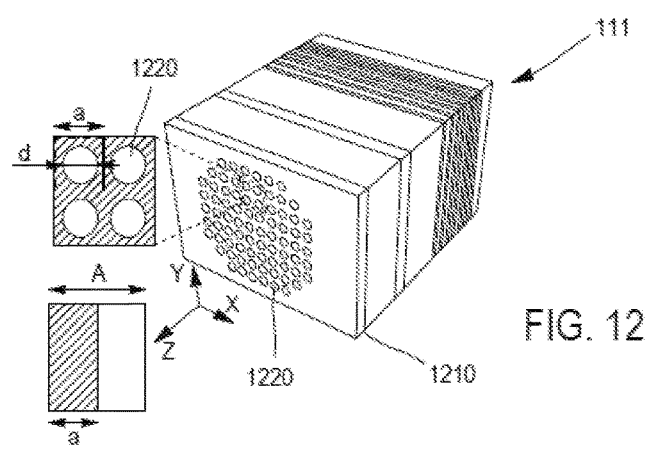
FIG. 12 is a laser device according to the invention with a diffractive mask onto the semiconductor element.

FIG. 12 is a laser device 100 according to the invention with a diffractive mask onto the semiconductor element 111 as described previously. It consists of a single $Si_3N_4$ layer 1210 perforated by a 2D array of holes 1220 of diameter d placed on a square grid of period a. the diameter of the holes may be constant or variant, considering the effects sought. The perforated single layer Si3N4 is a Photonic Crystal Mirror and is deposited onto the top surface of the half VeCSEL 111 as for the absorbing masks. The principle is closed to the absorbing ones but the principle is founded on diffractive effects instead of absorbing effects. Thus, light is diffracted in order to diffract the Laguerre-Gauss modes that are undesired.

Figure 13:
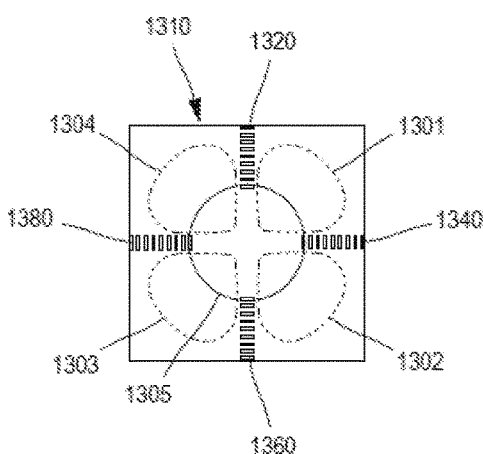
FIG. 13 illustrates one another diffractive mask design.

FIG. 13 illustrates one another diffractive mask design that introduces losses onto the optical wave 107 that is resonating inside the laser cavity. The diffractive mask 1310 according to this embodiment is composed with four diffracting gratings 1320, 1340, 1360, 1380 etched onto the two axis of symmetry of the spatial filter 1310. In the illustrated example, the pitch is 1 μm and the size of each mark is 200 nm. Two modes are selected thanks to this kind of crystal photonics diffractive mask: the main mode $TEM_{00}$ 1305 as a circular line centered onto the mask and the $LG_{02}$ mode as one concave-closed shaped curve (1301-1304) in each corner of the mask.

The typical thickness of the dielectric deposition on which the diffractive structures are etched is about the half of the wavelength to the eighth of the wavelength.

The diffractive masks may be fabricated by some microelectronic techniques, as for the absorbing masks.

Third Mode of Realization: Intensity-patterned Laser Beam Pumping Device

In this particular mode of realization, means for shaping the light intensity of the optical wave 107 that is resonating inside the laser cavity is no longer a mask that provides some losses but it's now about the optical pumping.

In the two previously exposed mode of realization, optical pumping is quite homogeneous over the desired beam size—either Gaussian type or top hat type profile—onto the active surface of the semiconductor element on which the pumping occurs.

It is showed with the present invention that an equivalent result than the one provided by the spatial filters may be obtain with a non-homogeneous pumping pattern.

The spatial transverse filter is mounted onto the optical components that focus the pumping laser beam 110 onto the active surface of the semiconductor element, in order to decrease its intensity in some areas, named absorbing areas, and to allow light transmission in some other areas, named transmitting areas. The shape and the location of those areas onto the pumping laser beam 110 are designed in order to be projected onto the active surface onto the semiconductor element, and to be superposed with the transverse Laguerre-Gauss modes that are sought to be intercepted. Only those corresponding with the transverse Laguerre-Gauss modes that are sought to be selected will be effectively pumped by this non-homogeneous intensity pumping laser.

In some other embodiments of the present invention, another type of pump shaping technique may be to focus two elliptical pump beam (cross axis) onto the semiconductor chip to produce a petal like shape pump area.

Figure 14:
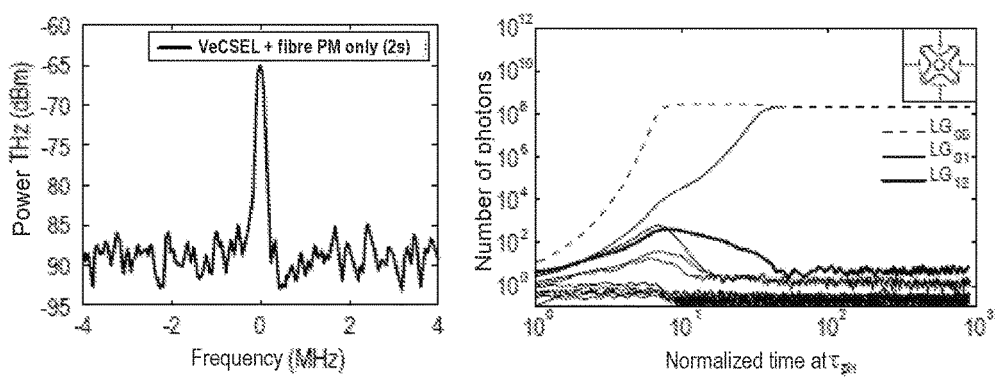
FIG. 14 illustrates THz spectrum of the photo-mixed dual-frequency Laguerre-Gauss VeCSEL and the temporal evolution of its mode intensity.

FIG. 14 illustrates the THz spectrum of the photo-mixed dual-frequency Laguerre-Gauss VeCSEL and the temporal evolution of its mode intensity. It proves the simultaneous laser generation of two mutually coherent (i.e. exhibiting low relative phase noise) optical waves inside a unique VeCSEL cavity, in continuous wave operation at 300K at moderate power (35 mW).

It demonstrates the coherent THz wave generation by photo-mixing the dual-frequency LG VECSEL in a UTC PhotoDiode, and confirms the laser dynamics theoretical study, showing simultaneous emission of the two LG modes, at steady state, of the dual frequency VECSEL.

Figure 15:
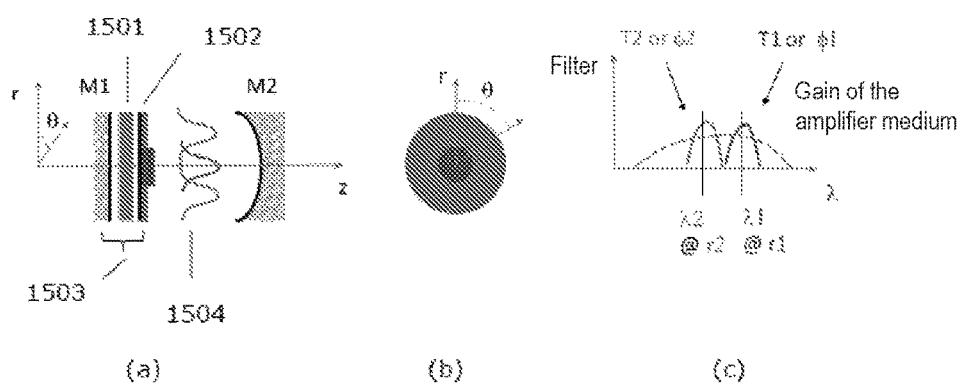
FIG. 15 is a schematic illustration of a spectral filter allowing shaping phase profile of the optical wave oscillating in the optical cavity.

FIG. 15 is a schematic illustration of a spectral filter allowing shaping phase profile of the optical wave oscillating in the optical cavity.

The diagram (a) illustrates an optical cavity in which two transverse modes are selected (the means are not represented) and including a spectral filter in order to adjust the frequency difference between the two modes, the diagram (b) illustrates a front view of said spectral filter, and the diagram (c) illustrates on the one hand the bandwidth of such a spectral filter, for the two transverse modes oscillating inside the optical cavity and on the other hand the gain of the amplifier medium.

According a particular mode of realization, the device according to the invention may comprise between the two mirrors M1 and M2 forming the optical cavity—besides the non-represented means for selecting at least two transverse modes—an absorbing spectral filter and/or an amplifying spectral filter 1503 patterned in order to generate a phase shift between the transvers modes and to adjust the frequency difference between the two transverses modes ($\lambda 1$, $\lambda 2$) oscillating inside the optical cavity. The intensity between the two transverse modes in the optical cavity is illustrated by 1504.

This filtering may be for example achieved by a Lyot filter or a Farby-Perot filter comprising a gain medium or/and a loss medium. The adjusting of the optical cavity may be achieved by adjusting said filter so that each oscillating mode $\lambda 1$, $\lambda 2$ travels a different optical wavelength across the filter. In other terms, the spectral filter is arranged to represent a refractive index, even to represent a non-uniform transverse optical wavelength, in order to generate a phase shift between the two oscillating transverse modes.

As a non-limited example, such filter may be achieved by a Bragg mirror (1-10 pairs) with low reflectivity disposed on the semi-conductor structure (i.e. VCSEL for example). Such a mirror may be made by micro-electronic coting processes. Such spectral filter allows advantageously achieving a "standard factory setting" of the frequency difference between the two transverse modes.

However, such spectral filter may be dynamic in order to propose a mean for controlling the frequency difference between the two transverses modes oscillating inside the optical cavity. It can be for example a controllable liquid crystal pixels matrix.

The adjusting of the characteristic dimensions of such a mirror allows the control of the "detected" refractive index of each transverse mode oscillating inside the cavity; and it is possible for example to increase the thickness of the first crossed optical material by a first mode, and to control precisely the desired frequency difference of the device according to the invention. More particularly, the refractive index values (thus the thickness) of the central region of said filter are modified compared to the peripheral region. For example, it is possible to etch on the Bragg mirror surface a phase shifting over-layer of a thickness less than $\lambda/2$ for one of the transverse mode compared to the other transverse mode.

It is also possible to add a phase shifting structure, for example a photonic crystal or a meta-material with a refractive index spatially controlled by the characteristic dimensions of a network. For example, it can be a bi-dimensional bores network of which the diameters and the periodicity evolve according to a particular pattern which determine the phase profile of the transverse modes. Thus, it is possible to achieve a desired particular phase profiles, particularly continuous, allowing a precise adjustment between the modes.

Furthermore, in order to displace spectrally this frequency difference, and as described above, it is possible to achieve a non-uniform transversal heating in order to modify locally the refractive index value of the material and to control the phase shift between the two transverse modes and thus the frequency difference.

Figure 16:
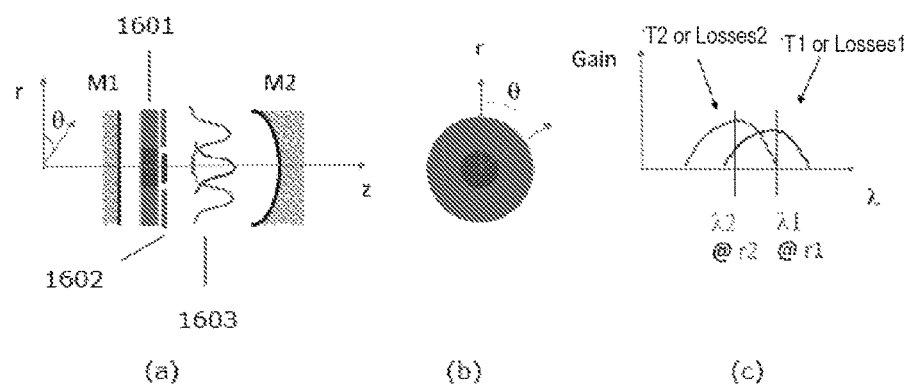
FIG. 16 schematically illustrates a realization mode of the device according to the invention, in which a non-uniform gain medium allows the adjustment of the frequency difference between the selected two transverse modes.

FIG. 16 schematically illustrates a realization mode of the device according to the invention, in which a non-uniform gain medium allows the adjustment of the frequency difference between the selected two transverse modes, the means for selecting the two transverse modes are not represented.

The diagram (a) illustrates an optical cavity comprising a non-uniform gain medium, the diagram (b) illustrates a front view of the gain medium, and the diagram (c) illustrates a bandwidth of the gain medium.

The device according to the invention may comprise between the two mirrors M1 and M2 forming the optical cavity at least a gain medium 1601, 1602 arranged to adjust the frequency difference between the two transverse modes ($\lambda 1$, $\lambda 2$) oscillating inside the cavity. The intensity of the transverse modes oscillating inside the cavity is illustrated by 1603.

In the case of a semi-conductor laser for example, such adjusting can be achieved using a non-uniform transverse losses in the gain medium, and/or a non-uniform distribution of charge carriers inside the gain medium. Thus, the intensity of the emission wavelength gain varies transversally and allows adjusting the frequency difference between the transverse modes.

Additionally or alternatively, the device according the invention may comprise at least one transversally non-uniform losses mask between the two modes in order to adjust the frequency difference between the two modes.

The invention claimed is:
1. A laser device for generating an optical wave comprising at least two frequencies, the laser device comprising:

a first element comprising a gain region located between one first end defined by a first mirror and a second end defined by an exit region;

a second mirror, distinct from the first element, and arranged so as to form with the first mirror an optical cavity including the gain region and a gap between the exit region and the second mirror;

means for pumping the gain region so as to generate the optical wave;

means for shaping the light intensity of the optical wave arranged for selecting at least two transverse modes of the optical wave, said means for shaping the light intensity comprise at least one mask, each mask being patterned with a surface having a non-uniform absorbance, said surface including at least one absorbing area and/or at least one transmitting area; and means for shaping a longitudinal and/or transversal phase profile of the optical wave and arranged for adjusting at least two transverse modes of the optical wave, said means for shaping the phase profile comprise at least one photonic crystal and/or diffraction grating located at least one end of the gain region and patterned to shape the transverse phase and/or the transverse intensity of the optical wave.

2. The device according to claim 1, wherein each mask is a nanometer-thick layer.

3. The device according to claim 1, wherein the absorbing area provides an absorbance at least twice higher than the absorbance of the transmitting area.

4. The device according to claim 1, wherein each mask is located at an anti-node value of the optical wave inside the cavity.

5. The device according to claim 1, wherein the mean for shaping the longitudinal phase profile of the optical wave presents a non-uniform transverse gain distribution inside the optical cavity to transversally modulate the intensity of the emission wavelength gain and to adjust the frequency difference between the at least two transverse modes.

6. The device according to claim 5, wherein the means for shaping the longitudinal phase profile of the optical wave further comprises at least a transversally non-uniform losses mask between the two modes to adjust the frequency difference between the two modes.

7. The device according to claim 1, wherein the means for shaping the phase profile of the optical wave comprises a spectral filter presenting a non-uniform optical wavelength along its transverse section to adjust the frequency difference between the at least two transverse modes of the optical wave.

8. The device according to claim 7, wherein the spectral filter comprises a bi-dimensional micro-etching network which of the characteristic dimensions, such as the diameter and their repetition pattern, are adjusted to generate a predetermined transverse profile of the optical wavelength of said filter and a phase shift of each transverse mode oscillating in the cavity, allowing to fix a frequency difference value between said at least two transverse modes.

9. The device according to claim 8, wherein the spectral filter comprises furthermore a means for dynamic control of the optical wavelength transverse profile of said spectral filter, such as a controllable crystal liquid pixel matrix.

10. The device according to claim 1, wherein the means for pumping the gain region comprise:

a pump laser emitting a pumping laser beam;

means arranged for spatially shaping the pumping laser beam intensity; and means for spatially shaping the pumping laser beam intensity and arranged to project a pumping beam intensity pattern onto the exit region of the first element corresponding with the at least two selected transverse mode of the optical wave.

11. The device according to claim 1, wherein the second mirror is a concave mirror or a phase conjugator mirror.

12. The device according to claim 1, which further comprises tuning means for moving the second mirror so as to change the length of the optical cavity.

13. The device according to claim 1, which further comprises means for tuning the frequency difference between the at least two modes of the optical wave.

14. The device according to claim 13, for which said means for tuning the frequency difference are thermal tuning means arranged to establish a thermal gradient into the transverse direction of the first element.

15. The device according to claim 14, in which the means for thermal tuning comprises one of the following components:

at least one local thermal conducing element transversally mounted on the first element and arranged to conduct or dissipate heat; and/or means for modulating a pump laser power in order to heat:

the exit region of the first element; and/or the means for spatially filtering; and/or a shaped pumping laser beam that enhanced and/or optimized the thermal gradient across the transverse directions of the optical wave propagation.

16. A method for generating an optical wave comprising at least two frequencies and comprising at least one of the following steps:

generating an optical wave inside a gain region;

pumping the optical wave with means for pumping; and shaping the light intensity and/or profile of the optical wave for selecting at least two transverse modes optical wave.

17. The method according to claim 16, wherein the step of selecting the at least two transverse modes of the optical wave consists in spatially filtering the optical wave intensity.

18. The method according to claim 16, further comprising the step of according the length of the optical cavity to shift the at least two optical wave frequencies.

19. The method according to claim 16, further comprising the step of tuning the frequency difference between the at least two modes.

20. A utilization of the laser device according to claim 1 for THz generation with photomixing techniques, wherein the at least two modes selected are injected into a waveguide.

* * * * *